(12) United States Patent
Segev

(10) Patent No.: US 9,009,402 B2
(45) Date of Patent: Apr. 14, 2015

(54) CONTENT ADDRESSABLE STORAGE IN LEGACY SYSTEMS

(71) Applicant: Yaron Segev, RaAnana (IL)

(72) Inventor: Yaron Segev, RaAnana (IL)

(73) Assignee: EMC Corporation, Hopkinton, MA (US)

( * ) Notice: Subject to any disclaimer, the term of this patent is extended or adjusted under 35 U.S.C. 154(b) by 317 days.

(21) Appl. No.: 13/623,148

(22) Filed: Sep. 20, 2012

(65) Prior Publication Data
US 2014/0082273 A1 Mar. 20, 2014

(51) Int. Cl.
G06F 12/00 (2006.01)
G06F 13/00 (2006.01)
G06F 13/28 (2006.01)
G06F 11/14 (2006.01)

(52) U.S. Cl.
CPC ........ *G06F 11/1453* (2013.01); *G06F 11/1469* (2013.01)

(58) Field of Classification Search
CPC ............ G06F 11/1453; G06F 11/1469; G06F 17/30097; G06F 3/0685
USPC .................................. 711/108, 154, 161–162
See application file for complete search history.

(56) References Cited

U.S. PATENT DOCUMENTS

| 7,788,220 | B1 * | 8/2010 | Auchmoody et al. | ......... 707/609 |
| 7,949,630 | B1 * | 5/2011 | Auchmoody | .................. 707/609 |
| 2013/0036091 | A1 * | 2/2013 | Provenzano et al. | ......... 707/624 |

* cited by examiner

*Primary Examiner* — Ryan Bertram
(74) *Attorney, Agent, or Firm* — Krishnendu Gupta; Konrad R. Lee

(57) ABSTRACT

A CAS data storage system replicates data on a non-CAS storage device. The CAS storage device recognizes duplicate data and stores the data only once, whereas the non-CAS device does not recognize duplication of data and requires full storage of the data. The CAS data storage device saves on redundant data transfer by transferring, in the case of duplicate data, the address of a primary location at which the data is stored and the address of the current duplication. The CAS data storage system includes a hash→address table for this purpose. The non-CAS storage device then copies its own data from the primary location into the current location.

12 Claims, 5 Drawing Sheets

CONTENT ADDRESSABLE STORAGE IN LEGACY SYSTEMS

FIELD AND BACKGROUND OF THE INVENTION

The present invention relates to Content Addressable Storage, CAS, and its use with legacy systems, and more particularly but not exclusively, to replication techniques using CAS where the source system is a CAS system and the destination system that replicates the source is a legacy or any other system that does not allow for CAS.

Content Addressable Storage, CAS, also referred to as associative storage, is a mechanism for storing information that can be retrieved based on the content rather than on the storage location. CAS is typically used for storage and retrieval of fixed content and for archiving or permanent storage.

In Content Addressable Storage, the system records a content address, a key that uniquely identifies the information content. A hash function is typically used as the key to identify the data content, and the quality of the system depends on the quality of the hash function. Too weak a hash function may lead to collisions between different content items, whereas too strong a hash key leads to inefficiency in data storage.

A typical CAS storage space has access nodes through which input and output is handled and storage nodes for permanent storage of the data, and CAS metadata allows for content addressing and retrieval within the system.

Often the storage space requires to be backed up, and thus a replication of the source space may be constructed at a destination location. The source and destination spaces are often not located physically together and there may be bandwidth limitations and latency involved in communication between the two. For the purpose of replication, nodes at the source storage space are required to provide consistent copies of input data to the destination, and any system has to allow for failures at one location or another in a way that takes account of the latency within the system. Two close-together operations on the same data may otherwise result in inconsistent replication.

It is furthermore desirable to avoid unnecessary data transfer in view of limitations on bandwidth. If the destination system is a CAS system then the amount of storage space can be reduced simply by transferring the data only the first time it is used and subsequently merely transferring the hash information. Since the destination system is a CAS system, the hash is sufficient information for it to be able to perform the replication.

If the destination system is not itself a CAS system then the hash is of no help. The data is stored independently each time and needs to be transferred independently each time since the non-CAS system has no way of identifying two identical data items stored at different locations.

SUMMARY OF THE INVENTION

The present embodiments may provide a reduction in the latency and amount of data transfer during replication to the legacy system to an extent equivalent to the amount possible if the destination system were a Content Addressable Storage system.

In the present embodiments, the source system maintains a table linking the hash with an address at which the data is stored. On second and subsequent occasions on which the same data is encountered, the source is able to make the connection via the hash and sends just the address. The destination is then able to look up the data at the address sent and copy the data to the new address to complete the replication. Thus repeat data no longer needs to be sent over the connection.

According to an aspect of some embodiments of the present invention there is provided a data storage system with backup protection using data replication, the system comprising:

at least one source CAS data storage space; and
a destination data storage space not having or not known to have CAS capabilities;
the source CAS storage space comprising:
an input for receiving data and corresponding addresses for storage in the source data storage space;
a hash key generator for generating a hash key of a data item;
a hash key to address storage table configured to store respective hash keys in the source storage space in association with corresponding logical addresses, to retrieve the addresses following input of a hash key;
an address to hash key storage table connecting each logical address to a respective corresponding hash key, to retrieve respective hash keys following input of a respective address;
a hash key inspection unit configured to compare stored hash keys against hash keys generated from further data items arriving at the source storage space to determine whether respective further data items are already stored, the source storage system configured to transfer, to the destination storage space, respective further data items together with corresponding addresses if no match is made to a stored hash key, and if a match is made to a stored hash key, then to transfer to the destination storage space both the address corresponding to respective further data items and respective addresses corresponding to the stored hash keys, without transferring the respective further data item; and
the destination data storage space being configured to use the address corresponding to the stored hash key to obtain the respective further data item and to copy the respective further data item to the address corresponding to the data item.

In an embodiment, the source data storage system is configured to obtain the address corresponding to the stored hash key from the hash to address table for the transferring.

In an embodiment, the address corresponding to the hash and the address corresponding to the further data are respectively logical addresses.

In an embodiment, the address corresponding to the hash and the address corresponding to the further data are respectively logical addresses within a logical address range and the hash key to address storage table comprises all of the logical address range.

In an embodiment, the address corresponding to the hash and the address corresponding to the further data are respectively logical addresses within a logical address range and the hash key to address storage table comprises only parts of the logical address range currently in use.

According to a second aspect of the present invention there is provided a source CAS data storage device for storing incoming data and maintaining a replica of the stored data at a destination data storage space not having or not known to have CAS capabilities, the source CAS data storage device comprising:

a source CAS data storage space;
an input for receiving data and corresponding addresses for storage in the source data storage space;
a hash key generator for generating a hash key of a data item;

a hash key to address storage table configured to store respective generated hash keys in the source storage space and to link respective hash keys to retrieve corresponding addresses;

an address to hash key storage table connecting each hash key to an address at which corresponding data is placed to retrieve respective hash keys on entry of corresponding addresses; and a hash key inspection unit configured to compare prestored hash keys against hash keys generated from further data items arriving at the source storage space to determine whether respective further data items are already stored, the source storage system configured to transfer, to the destination storage space, respective further data items together with corresponding addresses if no match is made to a prestored hash key, and if a match is made to a prestored hash key, then to transfer to the destination storage space both the address corresponding to the further data item and the address corresponding to the hash key, without transferring the respective further data item.

According to a third aspect of the present invention there is provided a destination storage device for use with a CAS source storage system, to replicate data stored at the CAS data storage system, the destination storage system comprising:

a replication storage space;

an input to receive from the source CAS storage system a first logical address of a current data item and a second logical address at which a data item identical to the current data item was previously provided; and a copy unit for coping a data item from the second logical address to the first logical address.

According to a fourth aspect of the present invention there is provided a data replication method comprising:

receiving data and corresponding addresses for storage in a source CAS data storage space;

generating a hash key of respective received data items;

generating a hash key to address storage table to store generated hash keys in the source CAS storage space to link respective hash keys to corresponding addresses;

comparing prestored hash keys against hash keys generated from further data items arriving at the source storage space to determine whether respective further data items are already stored; and replicating, at a destination storage space, data stored at the source storage space by transferring, to the destination storage space, respective further data items together with corresponding addresses if no match is made to a prestored hash key, and if a match is made to a prestored hash key, then transferring to the destination storage space both the address corresponding to the data item and the address corresponding to the hash key, without transferring the respective further data item.

The method may further comprise, at the destination storage space, using the address corresponding to the hash key to obtain the respective further data item and to copy the respective further data item to the address corresponding to the data item.

The method may further comprise generating at the source data storage system, an address to hash table together with the hash to address table.

In an embodiment, the address corresponding to the hash and the address corresponding to the further data are respectively logical addresses.

In an embodiment, the address corresponding to the hash and the address corresponding to the further data are respectively logical addresses within a logical address range and the hash key to address storage table comprises all of the logical address range.

In an embodiment, the address corresponding to the hash and the address corresponding to the further data are respectively logical addresses within a logical address range and the hash key to address storage table comprises only parts of the logical address range currently in use.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. The data processor may include a volatile memory for storing instructions and/or data and/or a non-volatile storage, for example, a magnetic hard-disk, flash memory and/or removable media, for storing instructions and/or data. A network connection may be provided and a display and/or a user input device such as a keyboard or mouse may be available as necessary.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
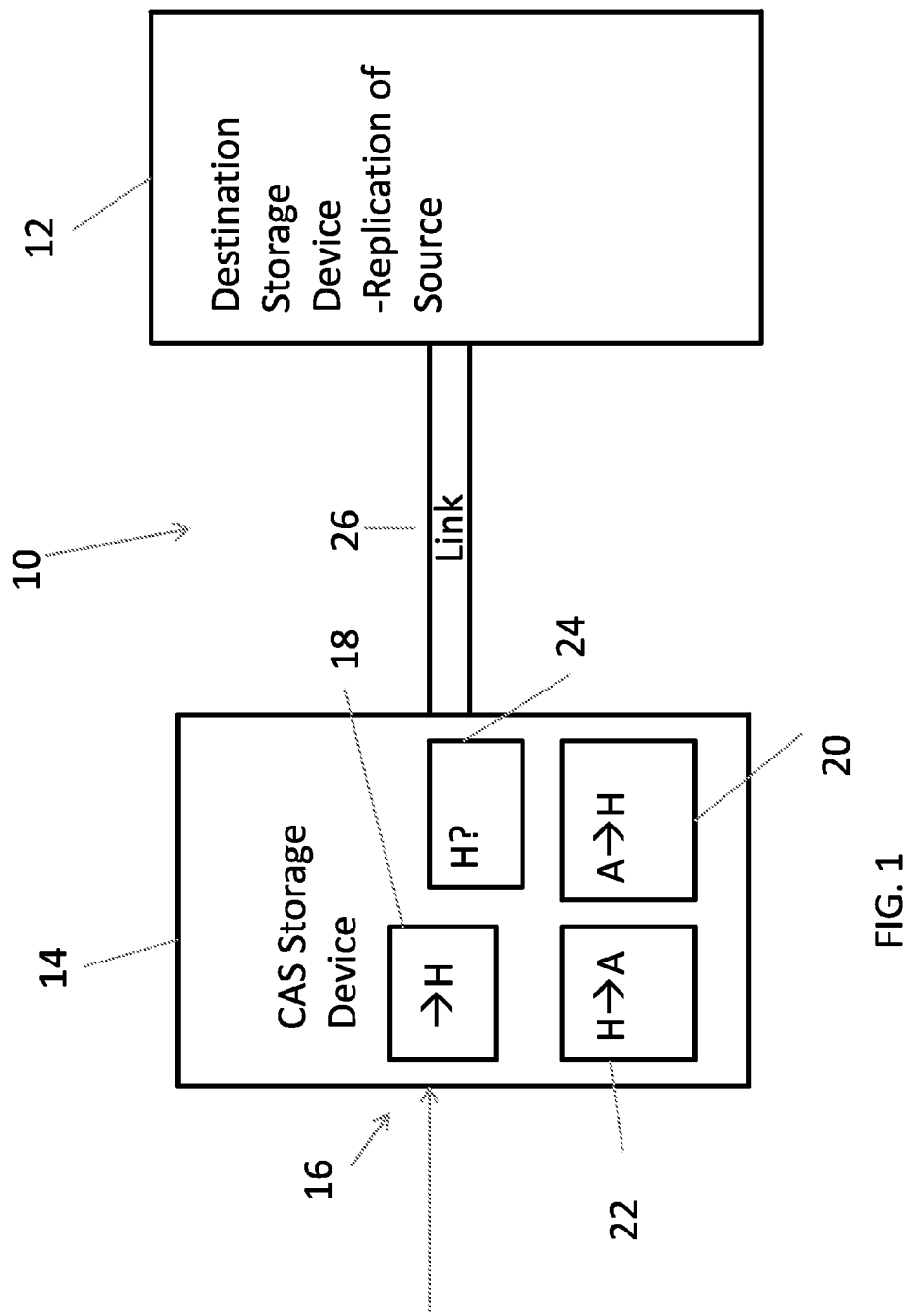
FIG. 1 is a simplified diagram of a data storage system with replication according to a first embodiment of the present invention.

The present invention, in some embodiments thereof, relates to a CAS data storage system that includes replication for data protection, and more particularly to a system that provides for remote replication of the data at a separate device that may not be a CAS device.

More particularly but not exclusively, a CAS data storage system replicates data on a non-CAS storage device. The CAS storage device recognizes duplicate data and stores the data only once, whereas the non-CAS device does not recognize duplication of data and requires full storage of the data. The CAS data storage device saves on redundant data transfer by transferring, in the case of duplicate data, the address of a primary location at which the data is stored and the address of the current duplication. The CAS data storage system includes a hash→addresses table to allow it to find a logical address for the primary storage of the hash. The non-CAS storage device then copies its own data from the primary location into the current location.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 illustrates a CAS data storage system 10 with backup data replication at a non-CAS destination storage device 12 according to a first embodiment of the present invention. The system includes a source CAS data storage space 14. If both the source and destination storage spaces use content addressable memory then considerable communication bandwidth between the two storage spaces can be saved since whenever a data item is already present at the destination it is in effect present for the new data and does not need to be resent. However it is not always possible to ensure the availability of a CAS device for backup replication. Often the backup storage device replicating the source is a standard storage device that stores data at a physical address location associated with the logical address. In such a case there is no possibility of content addressing so that if the same data item appears multiple times in the data then that data item has to be stored multiple times in the standard storage device.

Nevertheless the present embodiments address the issue of redundant data transfer between such a CAS data storage space and a destination data storage space not having or not known to have CAS capabilities.

The source CAS storage space has an input 16 which receives data and either receives or provides corresponding logical addresses for storage in the source data storage space.

A hash key generator 18 generates a hash key of any arriving data item. The hash key is sufficiently robust to distinguish between different data items so that no two different data items may share the same hash. The hash is then used as the means for retrieving the data.

An address to hash storage table 20 stores logical addresses together with the generated hash keys in the source storage space. Thus the logical address can be entered to retrieve the hash key which in turn retrieves the actual data. If the same hash is already present in the table then it is not stored twice but instead the new logical address is linked to the original hash. In all events the same original data is obtained.

In addition there is provided a hash key to address storage table 22, which operates in the other direction and allows each hash key to be used to retrieve the corresponding logical addresses. As the hash key is stored once in the address to hash table 20, so it is stored only once in the hash to address storage table 22, thus establishing a primary storage location for the given hash.

When a new hash key appears, then the system may determine whether the data is new data or is in fact already present. To achieve this, a hash key inspection unit 24 compares the new hash keys against the stored hash keys. If no match is made, then the data item is new and needs to both be stored and transferred in its entirety. If a match is made then the data is already present in the source storage space. It is also present at the destination storage space, if one or more of the logical addresses pointing to this hash, which can be found in the hash to address storage table 22, were previously replicated to the destination storage device. The source data storage system simply points to the original data, as described above.

Figure 2:
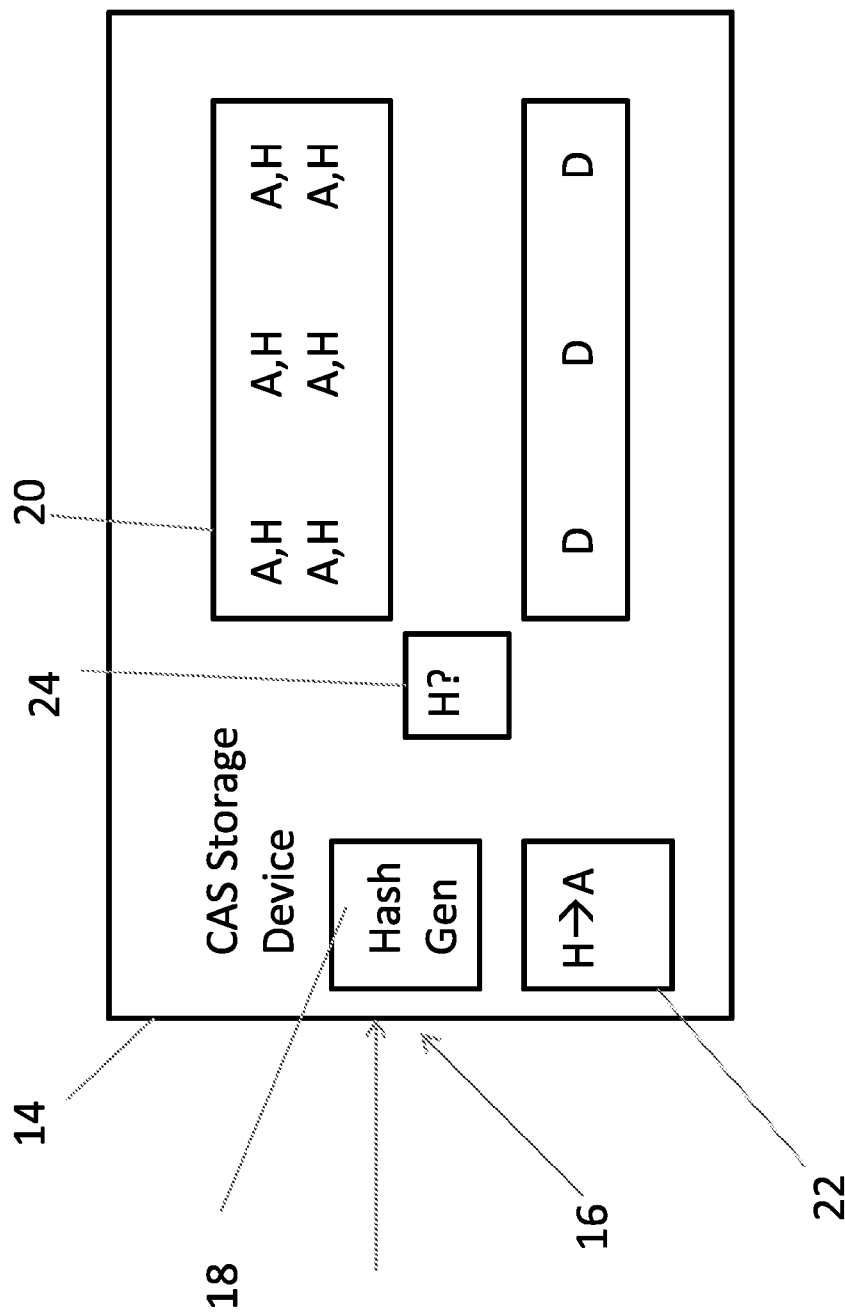
FIG. 2 is a simplified diagram illustrating in greater detail the CAS source data storage device of FIG. 1.

The source data storage space is shown in greater detail in FIG. 2.

It will be recalled that the destination data storage system requires the logical address and physical data, and is not capable of Content Addressable Storage. The present embodiments nevertheless avoid redundant data transfer by providing the destination with two pieces of information, the logical address to which the repeat data belongs and the logical address at which the data was originally stored. A logical address at which the data was originally stored, and which was replicated to the destination storage device, may be accessed using the hash from the hash to address table 22, as described above.

Figure 3:
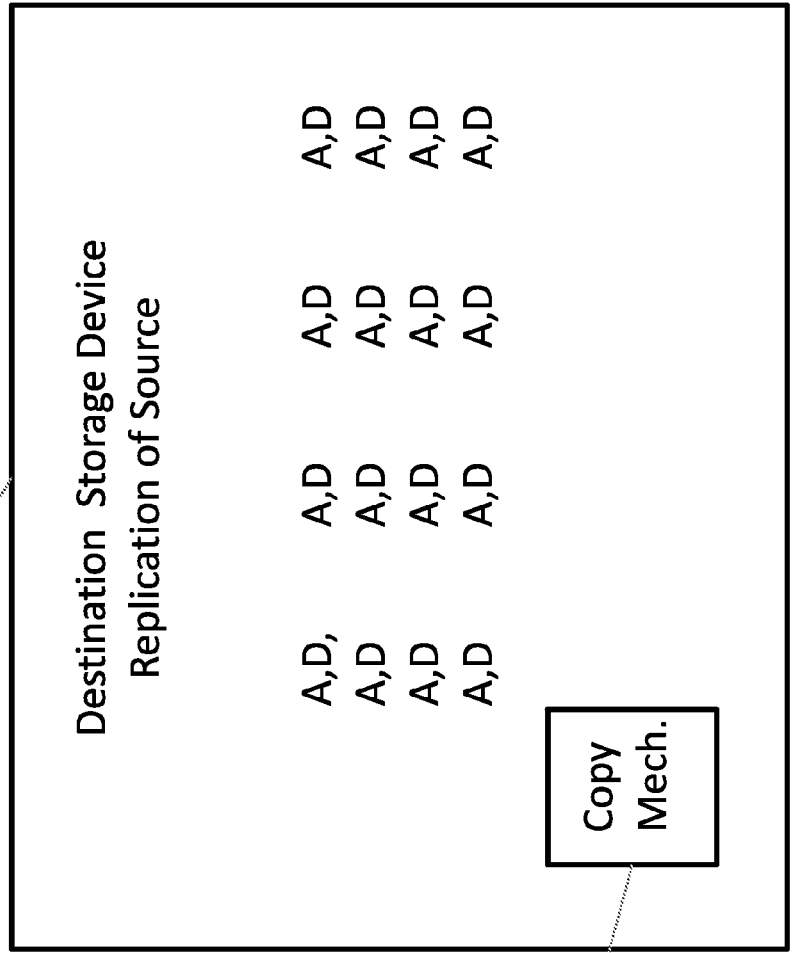
FIG. 3 is a simplified diagram illustrating in greater detail the destination non-CAS storage device of FIG. 1.

The destination storage device, is shown in greater detail in FIG. 3, to which reference is now made. On receipt of the logical address to which the repeat data belongs and the logical address of the initially stored hash, the destination storage device 12 uses copy mechanism 30 to copy the original data from the original address to the new address at which the repeat data goes.

Thus the system avoids the redundant resending of the original data a second time over the communication link 26, despite the fact that the destination storage device has no capabilities in respect of the hash keys, and requires full storage of data. The cost is merely the storage of an additional table, the hash to address table 22, at the source storage device. For each destination storage device, it must also be known which addresses have been replicated to it. This may be done in coarser granularity for metadata efficiency, for example on a volume basis.

The addresses in question are all logical addresses in a logical address range. Typically, most of the time, much of the logical address range is unused and thus the hash to address table, in principle covering the entire address range, can be made considerably smaller by not entering unused addresses.

Figure 4:
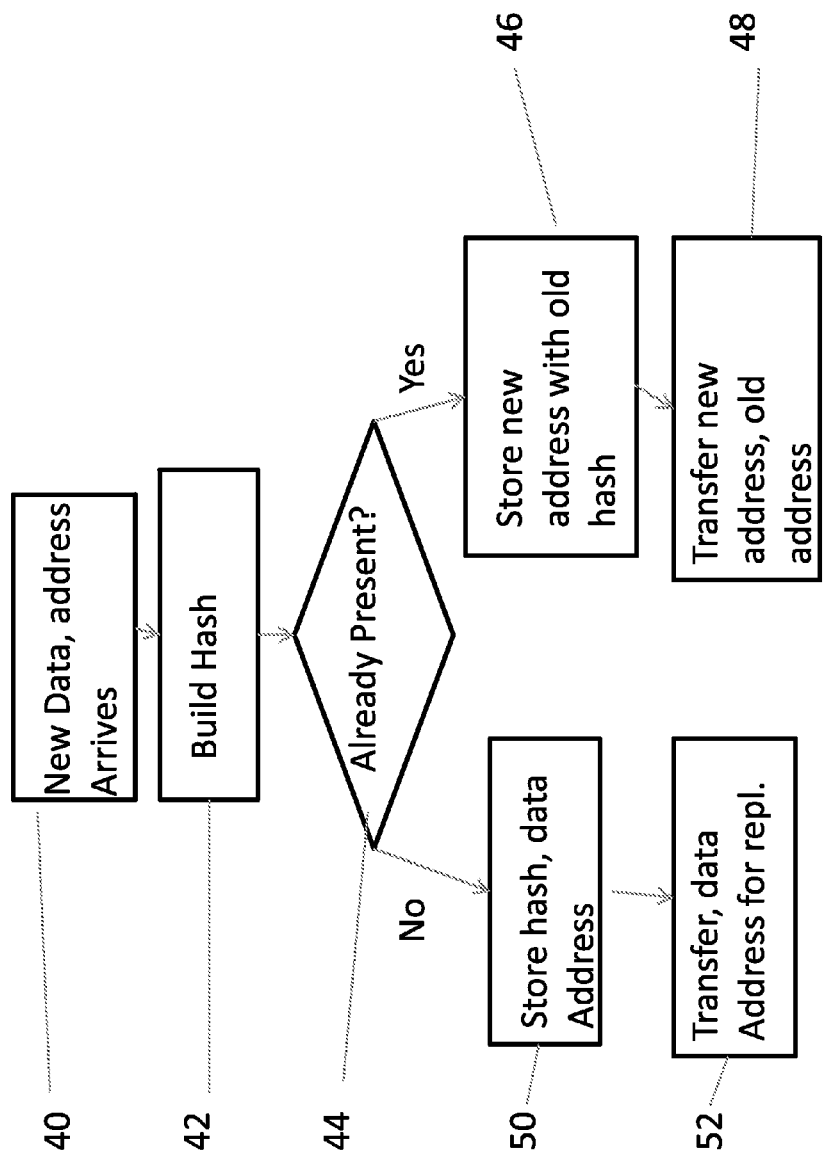
FIG. 4 is a simplified flow chart illustrating a data storage and backup procedure at the source data storage device of FIG. 1.

Reference is now made to FIG. 4, which is a simplified flow chart illustrating a procedure when new data arrives at the source data storage device. In block 40 the new data arrives, which may be accompanied by a logical address or may be assigned a logical address by the storage system. In block 42, a hash is built of the incoming data. The hash is then tested in block 44 against already stored hashes. If present then blocks 46 and 48 are followed. The new address is stored with the old hash and the new and old addresses are transferred to the replication destination storage device.

If the hash is not found in stage 44 then the hash and address are stored in both the hash to address table and the address to hash table, and the data itself is stored—block 50. Both the data and the logical address are transferred to the replication destination storage device in block 52.

Figure 5:
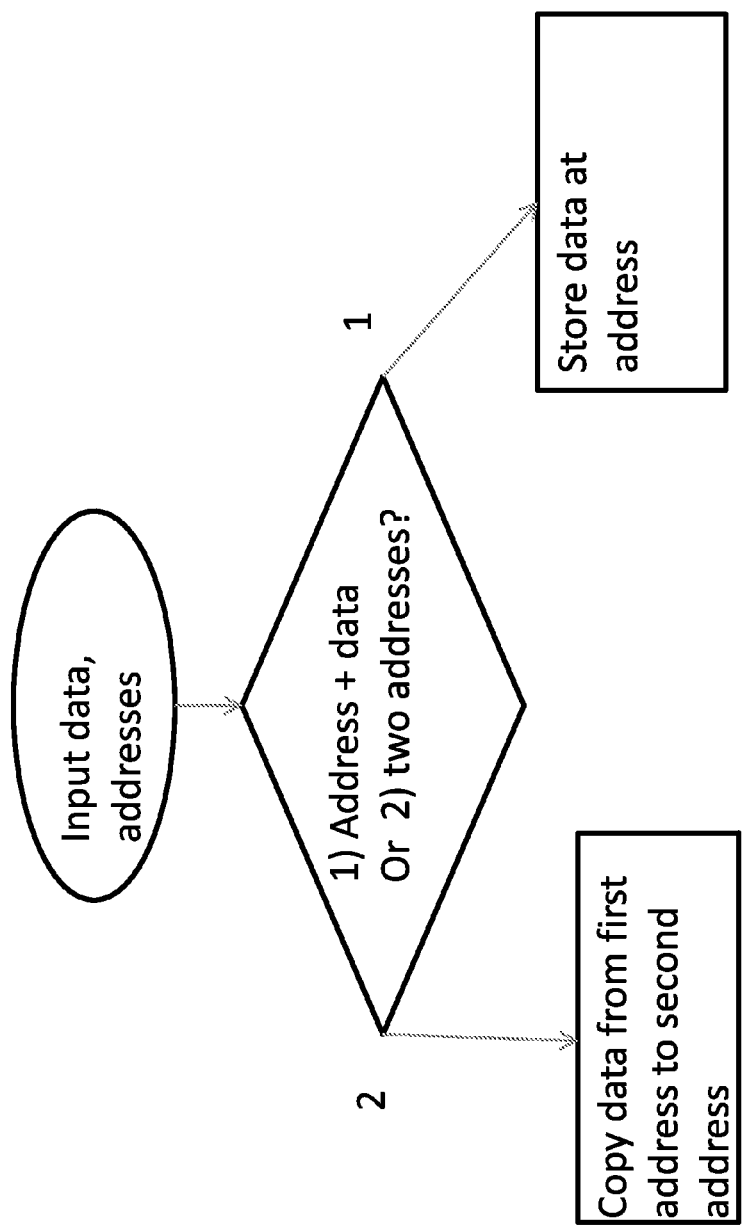
FIG. 5 is a simplified flow chart illustrating a data replication procedure at the non-CAS destination storage device of FIG. 1.

Reference is now made to FIG. 5, which is a simplified diagram illustrating operation of the destination storage device. The destination storage device receives input data and addresses—block 54. In block 56 the device determines which of two cases is currently in question, address+data—case 1 or two addresses—case 2. In case 1, the data plus address, the device simply stores the data at the address—block 58. In case 2—block 60, data present at the device at the first address is copied for duplicate storage at the second address.

In general, the logical address at the source device is the same address used at the destination device. In some cases the two devices may use different addressing schemes, in which case a mapping is provided between the two schemes.

It is expected that during the life of a patent maturing from this application many relevant pulse shaping and symbol decoding technologies will be developed and the scope of the corresponding terms in the present description are intended to include all such new technologies a priori.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment, and the present disclosure is to be understood as explicitly conveying to the skilled reader all such combinations. Conversely, various features of the invention, which are, for brevity, described in the context of a single embodiment, may also be provided separately or in any suitable subcombination or as suitable in any other described embodiment of the invention, and the present disclosure is to be understood as explicitly conveying to the skilled reader all such combinations. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A data storage system with backup protection using data replication, the system comprising:
   at least one source CAS data storage space; and
   a destination data storage space not having or not known to have CAS capabilities;
   said source CAS storage space comprising:
   an input for receiving data and corresponding addresses for storage in the source data storage space;
   a hash key generator for generating a hash key of a data item;
   a hash key to address storage table configured to store respective hash keys in the source storage space in association with corresponding logical addresses, to retrieve said addresses following input of a hash key;
   an address to hash key storage table connecting each logical address to a respective corresponding hash key, to retrieve respective hash keys following input of a respective address;
   a hash key inspection unit configured to compare stored hash keys against hash keys generated from further data items arriving at the source storage space to determine whether respective further data items are already stored, the source storage system configured to transfer, to said destination storage space, respective further data items together with corresponding addresses if no match is made to a stored hash key, and if a match is made to a stored hash key, then to transfer to said destination storage space both said address corresponding to respective further data items and respective addresses corresponding to said stored hash keys, without transferring said respective further data item; and
   said destination data storage space being configured to use said address corresponding to said stored hash key to obtain said respective further data item and to copy said respective further data item to said address corresponding to said data item.

2. The data replication system of claim 1, wherein said source data storage system is configured to obtain said address corresponding to said stored hash key from said hash to address table for said transferring.

3. The data replication system of claim 1, wherein said address corresponding to said hash and said address corresponding to said further data are respectively logical addresses.

4. The data replication system of claim 1, wherein said address corresponding to said hash and said address corresponding to said further data are respectively logical addresses within a logical address range and said hash key to address storage table comprises all of said logical address range.

5. The data replication system of claim 1, wherein said address corresponding to said hash and said address corresponding to said further data are respectively logical addresses within a logical address range and said hash key to address storage table comprises only parts of said logical address range currently in use.

6. A source CAS data storage device for storing incoming data and maintaining a replica of said stored data at a destination data storage space not having or not known to have CAS capabilities, the source CAS data storage device comprising:
   a source CAS data storage space;
   an input for receiving data and corresponding addresses for storage in the source data storage space;
   a hash key generator for generating a hash key of a data item;
   a hash key to address storage table configured to store respective generated hash keys in the source storage space and to link respective hash keys to retrieve corresponding addresses;

an address to hash key storage table connecting each hash key to an address at which corresponding data is placed to retrieve respective hash keys on entry of corresponding addresses; and a hash key inspection unit configured to compare prestored hash keys against hash keys generated from further data items arriving at the source storage space to determine whether respective further data items are already stored, the source storage system configured to transfer, to said destination storage space, respective further data items together with corresponding addresses if no match is made to a prestored hash key, and if a match is made to a prestored hash key, then to transfer to said destination storage space both said address corresponding to said further data item and said address corresponding to said hash key, without transferring said respective further data item.

7. A data replication method comprising:

receiving data and corresponding addresses for storage in a source CAS data storage space;

generating a hash key of respective received data items;

generating a hash key to address storage table to store generated hash keys in the source CAS storage space to link respective hash keys to corresponding addresses;

comparing prestored hash keys against hash keys generated from further data items arriving at the source storage space to determine whether respective further data items are already stored; and replicating, at a destination storage space, data stored at said source storage space by transferring, to said destination storage space, respective further data items together with corresponding addresses if no match is made to a prestored hash key, and if a match is made to a prestored hash key, then transferring to said destination storage space both said address corresponding to said data item and said address corresponding to said hash key, without transferring said respective further data item.

8. The method of claim 7, further comprising, at said destination storage space, using said address corresponding to said hash key to obtain said respective further data item and to copy said respective further data item to said address corresponding to said data item.

9. The method of claim 7, comprising generating at said source data storage system, an address to hash table together with said hash to address table.

10. The method of claim 7, wherein said address corresponding to said hash and said address corresponding to said further data are respectively logical addresses.

11. The method of claim 7, wherein said address corresponding to said hash and said address corresponding to said further data are respectively logical addresses within a logical address range and said hash key to address storage table comprises all of said logical address range.

12. The method of claim 7, wherein said address corresponding to said hash and said address corresponding to said further data are respectively logical addresses within a logical address range and said hash key to address storage table comprises only parts of said logical address range currently in use.

* * * * *